US009627641B2

(12) United States Patent
Schmid et al.

(10) Patent No.: US 9,627,641 B2
(45) Date of Patent: Apr. 18, 2017

(54) CHARGE CARRIER MODULATION FOR COLOR AND BRIGHTNESS COORDINATION IN ORGANIC LIGHT-EMITTING DIODES

(75) Inventors: Günter Schmid, Hemhofen (DE); Dan Taroata, Erlangen (DE)

(73) Assignee: SIEMENS AKTIENGESELLSCHAFT, Munich (DE)

(*) Notice: Subject to any disclaimer, the term of this patent is extended or adjusted under 35 U.S.C. 154(b) by 130 days.

(21) Appl. No.: 13/825,891

(22) PCT Filed: Sep. 20, 2011

(86) PCT No.: PCT/EP2011/066261
§ 371 (c)(1),
(2), (4) Date: Mar. 25, 2013

(87) PCT Pub. No.: WO2012/038389
PCT Pub. Date: Mar. 29, 2012

(65) Prior Publication Data
US 2013/0200353 A1    Aug. 8, 2013

(30) Foreign Application Priority Data
Sep. 24, 2010  (DE) .................. 10 2010 041 331

(51) Int. Cl.
*H01L 51/52*  (2006.01)
*H01L 51/50*  (2006.01)
*H01L 51/56*  (2006.01)

(52) U.S. Cl.
CPC .......... *H01L 51/5052* (2013.01); *H01L 51/52* (2013.01); *H01L 51/56* (2013.01)

(58) Field of Classification Search
None
See application file for complete search history.

(56) References Cited

U.S. PATENT DOCUMENTS 7,345,300 B2   3/2008  Qin et al.
7,791,068 B2   9/2010  Meng et al.
(Continued)

FOREIGN PATENT DOCUMENTS

DE   10224021    6/2006
EP   1531501     5/2005
(Continued)

OTHER PUBLICATIONS

Office Action mailed May 7, 2014 in corresponding Japanese Patent Application No. 2013-529625, 7 pages.
(Continued)

*Primary Examiner* — Whitney T Moore
*Assistant Examiner* — Scott R Wilson
(74) *Attorney, Agent, or Firm* — Slayden Grubert Beard PLLC

(57) ABSTRACT

The device for charge carrier modulation is a current-controlled component, which has semiconductor layers arranged on top of each other. The organic semiconductor layers arranged on top of each other are an electron transport layer, which is arranged between a first and a second hole transport layer, and/or a hole transport layer, which is arranged between a first and a second electron transport layer. The respective central layer is the modulation layer having a contact for a modulation voltage. By applying a modulation voltage, a modulation current flow is generated over the modulation layer. The modulation current flow influences the component current flow which flows from the first into the second hole or electron transport layer via the respective modulation layer.

12 Claims, 4 Drawing Sheets

(56) References Cited

U.S. PATENT DOCUMENTS

| | | |
|---|---|---|
| 8,120,242 B2 | 2/2012 | Yokoyama et al. |
| 8,680,693 B2 | 3/2014 | Kang et al. |
| 2004/0183088 A1* | 9/2004 | DenBaars et al. ............ 257/102 |
| 2005/0106419 A1 | 5/2005 | Endoh et al. |
| 2006/0208251 A1* | 9/2006 | Yoshizawa ..................... 257/40 |
| 2006/0250076 A1* | 11/2006 | Hofmann et al. ............ 313/504 |
| 2007/0013297 A1* | 1/2007 | Park ............................... 313/504 |
| 2007/0020483 A1 | 1/2007 | Park et al. |
| 2007/0096644 A1 | 5/2007 | Nishimura et al. |
| 2008/0246395 A1 | 10/2008 | Nakai et al. |
| 2009/0230384 A1 | 9/2009 | Meng et al. |
| 2011/0127510 A1* | 6/2011 | Seo ................... H01L 51/0052 257/40 |
| 2011/0248249 A1* | 10/2011 | Forrest et al. .................. 257/40 |
| 2012/0112318 A1 | 5/2012 | Yokoyama et al. |

FOREIGN PATENT DOCUMENTS

| | | |
|---|---|---|
| EP | 1748505 | 1/2007 |
| EP | 1978574 | 10/2008 |
| JP | 6-168785 | 6/1994 |
| JP | 2001-118681 | 4/2001 |
| JP | 2004-47882 | 2/2004 |
| JP | 2007-258308 | 10/2007 |
| JP | 2008-258396 | 10/2008 |
| JP | 2009-524189 | 6/2009 |
| WO | 03/100880 | 12/2003 |

OTHER PUBLICATIONS

International Search Report for PCT/EP2011/066261, mailed on Dec. 19, 2011.
German Office Action for priority German Patent Application No. 102010041331.3, issued on Jun. 27, 2011.
PCT/EP2011/066261, filed Sep. 20, 2011, Guenter Schmid et al., Siemens AG.
DE 102010041331.3, filed Sep. 24, 2010, Guenter Schmid et al., Siemens AG.
European Office Action for related European Patent Application No. 11766917.6, issued Nov. 12, 2014, 7 pages.
Japanese Notice of Allowance dated Jul. 14, 2015 in corresponding Japanese Patent Application No. 2013-529625.

* cited by examiner

CHARGE CARRIER MODULATION FOR COLOR AND BRIGHTNESS COORDINATION IN ORGANIC LIGHT-EMITTING DIODES

CROSS REFERENCE TO RELATED APPLICATIONS

This application is based on and hereby claims priority to International Application No. PCT/EP2011/066261 filed on Sep. 20, 2011 and German Application No. 10 2010 041 331.3 filed on Sep. 24, 2010, the contents of which are hereby incorporated by reference.

BACKGROUND

The present invention relates to organic semiconductor components and to the production thereof.

In the field of organic semiconductors, it is known that electron transport layers must be used for the transport of electrons as charge carriers and hole transport layers must be used for the transport of holes as charge carriers. In components in which both the charge carriers are used, for example in diode structures, the hole or electron current is influenced by the layer thickness of the respective transport layers or by the doping of the respective transport layers. As an alternative or in addition, suitable electron or hole injection layers may be connected upstream of the transport layer. Hole- or electron-blocking barrier layers may also be used in order to prevent or minimize transport of one charge carrier type.

An organic light-emitting diode is an example from the related art of a diode structure of organic semiconductors. Also in organic field-effect transistors, solar cells or photodetectors, the problem arises of the very different influence on electrons or holes as charge carriers due to the aforementioned factors such as layer thickness, doping, injection layers or barrier layers. In all these organic semiconductor components, after the production thereof the proportion of holes or the proportion of electrons with respect to the total current through the component is fixed.

SUMMARY

One potential object is to provide a component by which the charge carrier flow of one charge carrier type can be modulated.

The device proposed by the inventors is a current-controlled component, which comprises semiconductor layers lying on one another. The organic semiconductor layers lying on one another are an electron transport layer which is arranged between a first and a second hole transport layer, and/or a hole transport layer which is arranged between a first and a second electron transport layer. In this case, in particular, the organic semiconductor layers lie vertically above one another. In an advantageous configuration, the organic semiconductor layers lie on one another in a vertical layer stack. The introduction of a transport layer for the minority charge carriers of the transport layers enclosing it has the advantage of throttling the current of the majority charge carriers.

The term electron transporter refers to organic semiconductors in which the mobility of the electrons is very much greater than that of the holes, and the electron transport therefore constitutes the main current. The term hole transporter refers to semiconductors in which the mobility of the holes is greater than that of the electrons, and the hole transport therefore constitutes the main current. In principle, both charge carrier types exist in the organic semiconductor, and are divided into majority and minority charge carriers.

In an advantageous configuration, heterojunctions are formed between the semiconductor layers lying on one another. That is to say, the electron transport layer respectively forms a heterojunction with the first and second hole transport layers, and the hole transport layer between the electron transport layers respectively forms a heterojunction with the latter. This has the advantage of production as a thin-film component with a low operating voltage.

In another advantageous configuration, the electron transport layer between the first and second hole transport layers, and/or the hole transport layer between the first and second electron transport layers, is configured as a modulation layer. In this case, a modulation layer means that this layer is responsible for modulation of the charge carriers. The hole transport from the first hole transport layer into the second is in this case modulated by the electron transport layer, and the electron transport from the first electron transport layer into the second is influenced by the hole transport layer. The term "configured as a modulation layer" means that the semiconductor layer has a contact for a modulation voltage. With this contact, a modulation current across the modulation layer is generated by applying a modulation voltage. This modulation current influences the component current which flows from the first hole or electron transport layer into the second across the respective modulation layer. This component current is thus controllable by the modulation current. This configuration has the advantage in particular that the current of one charge carrier type in relation to the total current can be varied by a modulation voltage. The total current is composed of an electron current and a hole current.

In another advantageous configuration, the modulation layer has a thickness which is less than the diffusion length of the minority charge carriers in the semiconductor material of the modulation layer. The diffusion length of the minority charge carriers thus limits the layer thickness to a maximum layer thickness. Via the diffusion length, the maximum layer thickness is dependent on the applied voltage. This is because the diffusion length $L_{diff}$ of the charge carriers is dependent on the mobility $\mu$ of the charge carriers. The mobility of the charge carriers in organic semiconductor materials is in turn dependent on the field strength of the electric field, i.e. on the applied voltage and the layer thickness.

$$L_{diff} = \sqrt{D \cdot \tau} = \sqrt{\frac{k \cdot T}{q} \cdot \mu \cdot \tau}$$

Here, D is the diffusion coefficient, t is the lifetime, k is Boltzmann's constant, T is the temperature and q is the charge.

In another advantageous configuration, in the current-controlled component a modulation voltage is applied to the modulation layer and to the first hole or electron transport layer in such a way that the charge carriers to be controlled, namely the majority charge carriers in the semiconductor material of the transport layers and the minority charge carriers in the semiconductor material of the modulation layer, are moved from the first transport layer into the modulation layer. This configuration has the advantage that not only does the introduced modulation layer minimize or throttle the charge carrier flow, but also the latter can be increased. The total, or component, charge carrier flow, i.e.

the current from the first transport layer into the second in each case across the modulation layer, can thus be controlled by the modulation current which flows across the modulation layer.

The transport layers are preferably doped. In particular, the respective first transport layer, which lies upstream of the modulation layer in the charge carrier flow, is doped. In particular, the doping concentration of the transport layers, particularly the first transport layer, is between 0.01 vol % and 10 vol %. Expediently, the doping concentration of a transport layer is less than 50 vol %. Preferably, the doping concentration of a transport layer is preferably less than 20 vol %.

For example, the modulation layer is doped. In particular, the modulation layer has a doping concentration of between 0.01 vol % and 10 vol %. Expediently, the doping concentration of the modulation layer is less than 50 vol %. Preferably, the doping concentration of the modulation layer is less than 20 vol %.

The proposed current-controlled component may preferably be fitted in an organic light-emitting diode. This has the advantage that the hole and/or electron current in the organic light-emitting diode can be controlled separately.

In another advantageous configuration, the organic light-emitting diode comprises at least one current-controlled component as described above, the color rendering of the organic light-emitting diode being variable by application of the modulation voltage. The hole current or the electron current can be controlled by applying the modulation voltage to the component. The color rendering of the organic light-emitting diode is therefore dependent on how far electrons and/or holes penetrate into the emission zone of the light-emitting diode before they recombine.

In a particularly advantageous configuration, the organic light-emitting diode comprises at least one current-controlled component for controlling the hole current or for controlling the electron current, and it comprises an emission zone including at least two emission layers. In particular, the emission layers emit light of different colors. This has the advantage that the position of the recombination can be displaced into one of the two emission layers by controlling the electron current or hole current.

In another advantageous configuration, the organic light-emitting diode comprises at least one current-controlled component, the efficiency of the organic light-emitting diode being variable by application of the modulation voltage. The efficiency of a light-emitting diode is described by the ratio of the light emission to the current. In this context, it is not an increased conductivity through the component which is necessary, but rather it is the charge carrier balance between electrons and holes which is important. Only when equally many electrons and holes meet in the emission zone and recombine therein is a high efficiency of emitted light flux as a function of electric current in the component achieved. This charge carrier balance can be optimized by a current-controlled component with which the current of an individual charge carrier type can be controlled. In particular, a current-controlled component according to the proposals is respectively introduced into the organic light-emitting diode on both sides, on the electron transport side and on the hole transport side of the emission layer.

In another advantageous configuration, the organic light-emitting diode comprises two current-controlled components. Of these, one in particular is applied in order to control the electron transport between the cathode and the emitter layer. The component for controlling the hole transport is applied in particular between the anode and the emitter layer. Expediently, the current-controlled components comprise three organic semiconductor layers. These may be used as transport layers in the organic light-emitting diode. In particular, a current-controlled component is employed for controlling the electron current as an electron transport layer. A current-controlled component for controlling the hole current may, for example, be used as hole transport layers. The components thus respectively comprise suitable hole or electron transport layers. These are then separated by an only very thin layer which is suitable for transport of the respective other charge carrier type, i.e. it constitutes a blocking layer. The layer is, however, expediently so thin that the charge carriers which are the minority charge carriers in this layer can diffuse through it. That is to say, the layer thickness of the modulation layer is expediently less than the diffusion length of the minority charge carriers in the modulation layer.

For example, the current-controlled semiconductor components are suitable for charge carrier modulation for the construction of logic.

A charge carrier modulator for electrons and/or a charge carrier modulator for holes may be used for the coordination of a solar cell. In particular, when a plurality of organic solar cells are connected together, for example on a panel, a current-controlled component may be used for coordinating the solar cells with one another.

The proposed production method for a current-controlled component comprises the following:

A second organic semiconductor layer is first deposited on a first organic semiconductor layer. A third organic semiconductor layer is subsequently deposited thereon. The semiconductor layers are in particular deposited vertically on one another, i.e. the semiconductor layers are laterally extended and are vertically stacked on one another. For the first and third semiconductor layers, materials are used in which the same majority charge carrier type is electrically conducted. For the second semiconductor layer, a material is used which has a different majority charge carrier type to the first and third semiconductor layers. That is to say, when the first and third organic semiconductor layers are hole conductors, an electron conductor layer is applied between them as the second semiconductor layer. When the first and third semiconductor layers are electron conductors, a hole transport layer is deposited between them as the second semiconductor layer. The individual layers may furthermore, for example, also respectively be separated by an undoped intrinsic organic semiconductor layer. Such interlayers may, for example, be introduced in order to prevent mutual reaction of the dopants and therefore have a passivating effect.

This method has the advantage that the semiconductor layers form heterojunctions. No structuring methods, for example an elaborate lithography process, are necessary for the production of the layers of the component.

In another advantageous configuration of the production method, electrical contacting of the second semiconductor layer with a contact is carried out simultaneously with or directly after the deposition of the second semiconductor layer. Here, the term contacting with a contact means that, despite its small layer thickness in the semiconductor layer stack, the second semiconductor layer has a contact which can be contacted externally, for example by a voltage source. This contact is not in direct electrical contact with the third semiconductor layer. For example, the contacting with the contact is carried out by the second semiconductor layer being deposited by a modified layer layout, in particular by a modified layer layout in relation to the first and/or third semiconductor layer. The contact to which the second semiconductor layer is connected is, in particular, arranged laterally with respect to the layer stack. The contacting is carried out, in particular, in such a way that the second semiconductor layer is deposited simultaneously on the first semiconductor layer and on a contact arranged laterally with respect thereto. This has the advantage of a rapid and simple layer of the organic semiconductor without any intermediate or structuring steps.

In an advantageous configuration, the production method comprises the production of an organic light-emitting diode having a current-controlled component. In particular, the organic light-emitting diode may also comprise a plurality of current-controlled components. Preferably, an organic light-emitting diode is produced which has a current-controlled component for controlling the hole current and/or a current-controlled component for controlling the electron current. In the production method, between the anode and the emitter zone, an electron transport layer is deposited between a first and a second hole transport layer, and/or, between the emitter zone and the cathode, a hole transport layer is deposited between a first and a second electron transport layer. The emission zone in this case comprises at least one emitter.

Thus, a component controlling the electron current is introduced on the electron transport side and/or a component controlling the hole current is introduced on the hole transport side. These components may, in particular, respectively replace the electron transport or hole transport layers in the organic light-emitting diode. Between the anode and the current-controlled component, there may be a hole injection layer. Similarly, there may be an electron injection layer between the cathode and the current-controlled component. Between the current-controlled component for controlling the electron current and the emitter zone, there may also be a hole blocking layer. The current-controlled component may also be understood as a current throttling element or current restricting element. In particular, the component is not only current-controlled, but it also controls the current. The component is suitable for controlling the current of one charge carrier type. For example, in the production of such a component, at least one interlayer is thus introduced into an electron or hole transport layer, which interlayer does not conduct the charge carriers of the latter. That is to say, a throttling layer is first introduced. This throttling layer is now, however, not a static barrier for one charge carrier type, but is electrically modifiable. This electrical modification is carried out by applying a voltage to said interlayer, which makes the throttling layer into a modulation layer.

The principal functionality of a current-controlled component will firstly be explained with reference to a component for hole transport control. If a voltage is applied to the first and second hole transport layers, i.e. to the outer layers of the component, which is intended to transport the holes from the first hole transport layer into the second, an excess of holes occurs in the electron transport layer. These are the minority charge carriers in the electron transport layer, and are conducted significantly less well than in the hole transport layers.

Charge carrier stagnation therefore results. Owing to the excess, i.e. the accumulation of holes in the electron transport layer, a concentration gradient of the charge carriers is set up in the component. Owing to this charge carrier concentration gradient, a diffusion current flows so that the holes are conducted further toward the second hole transporter. The holes injected in the first hole transport layer are in this case accelerated in the strong electric field of the electron transporter.

Preferably, the first hole transport layer has heavy doping. This lies in particular between 0.01 vol % and 10 vol %. The doping concentration is, however, at most 20 vol %, at the very most 50 vol %. Free charge carrier concentrations in the range of from $10^{15}/cm^3$ to $10^{19}/cm^3$ are obtained. The modulation layer, i.e. the electron transport layer between the hole transport layers, may also have doping. This lies in particular in the same concentration range as that of the hole transporter.

Configuration of the component with a modulation layer, for example an electron transport layer between two hole transport layers, the layer thickness of which is less than the diffusion length of the minority charge carriers in the modulation layer, i.e. in particular the holes in the electron transport layer, is expedient. The small thickness of the modulation layer has the additional advantage that it does not substantially thicken an organic component into which the hole or electron modulation component is introduced. When used in organic light-emitting diodes, for example, which usually have electron or hole transport layers in the range of from 1 nm to 10 000 nm, the modulation layers do not cause a substantially greater component thickness. In particular when the transport layers are doped, the voltage drop across the overall component is increased only insubstantially. The efficiency of the organic light-emitting diode is therefore preserved.

In order to adjust or control an electron current, a current-controlled component comprising two electron transport layers and a hole transport layer arranged between them may be used. Heterojunctions are in turn formed between the semiconductor layers. When an external voltage is applied to the two electron transport layers, electron transport is intended to take place from the first electron transport layer into the second. This is reduced or prevented by the existence of the hole transport layer arranged between them. Owing to application of the modulation voltage to the first electron transporter and the hole transport layer, i.e. the modulation layer, electrons flow from the first hole transporter across the hole transport layer. The electron barrier, which is formed in the hole transport layer, is therefore reduced and an increased electron current flows from the first electron transporter into the second. In order to ensure the best possible conductivity of the electron current, above all high charge carrier densities must be respected in the first electron transport layer, which are for example ensured by suitably heavy doping of the layer. The doping concentration of the first electron transport layer is, in particular, between 0.01 vol % and 10 vol %. The doping concentration is, however, at most 50 vol %. Preferably, the doping concentration is less than 20 vol %. In order to prevent recombination from taking place in the hole transport layer, which is used as a modulation layer, the thickness of the hole transport layer is expediently selected in such a way that it is less than the diffusion length of the electrons in the hole transport material. The hole transport layer, or modulation layer, is preferably also heavily doped. In particular, there is a doping concentration of between 0.01 vol % and 10 vol % in the modulation layer.

In the absence of an applied modulation voltage, the modulation layer forms a throttling or barrier layer in the field of the component operating voltage. This modulation layer, introduced into the transport layers, prevents the charge transport. This, in particular, is due to the fact that the charge carriers accumulate and stagnate in the modulation layer, which is not suitable for their transport. This stagnation of the charge carriers in the throttling layer can be prevented or reduced by application of the modulation voltage, or the modulation current thereby generated. The charge carriers will in particular flow across the modulation layer owing to the modulation voltage, and thus promote the flow of current from the first transport layer into the second across the respective modulation layer. The modulation current thus controls the current through the component.

BRIEF DESCRIPTION OF THE DRAWINGS

These and other objects and advantages of the present invention will become more apparent and more readily appreciated from the following description of the preferred embodiments, taken in conjunction with the accompanying drawings of which.

DETAILED DESCRIPTION OF THE PREFERRED EMBODIMENT

Figure 1:
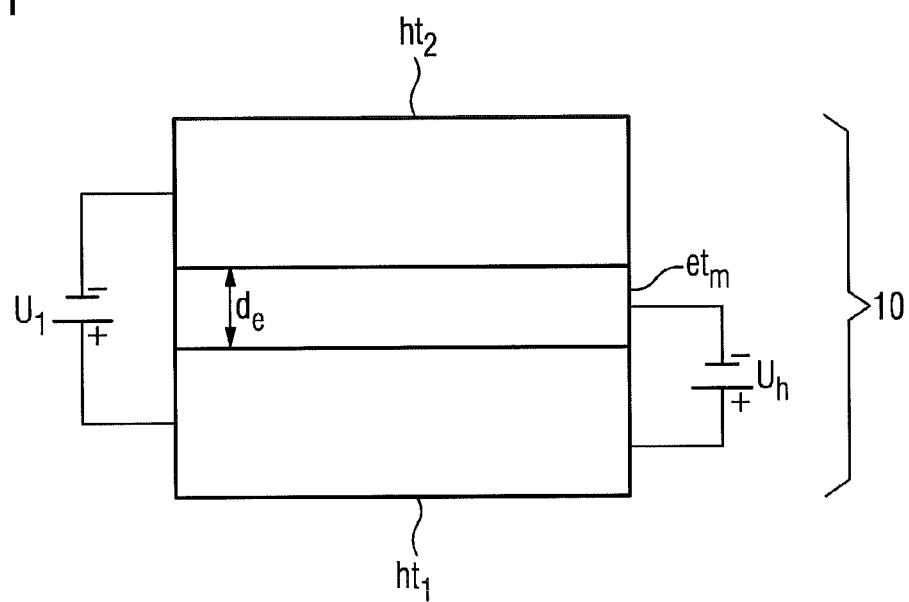
FIG. 1 shows a hole modulator.

Reference will now be made in detail to the preferred embodiments of the present invention, examples of which are illustrated in the accompanying drawings, wherein like reference numerals refer to like elements throughout.

The hole modulator 10 shown in FIG. 1 includes three organic semiconductor layers, which are arranged above one another. For the production of such a three-layer system, a first layer which is a hole transporter $ht_2$, a second layer which is an electron transport layer $et_m$, and a third layer which is a hole transport layer $ht_2$, are deposited. There is thus an electron transport layer $et_m$ between two hole transport layers $ht_1$ and $ht_2$.

This electron transport layer $et_m$ constitutes the modulation layer. The three organic semiconductor layers are respectively contactable. The first hole transport layer $ht_1$ is connected via a voltage source $U_1$ to the second hole transport layer $ht_2$. By the voltage supply $U_1$, a voltage $U_1$ can be applied to the two outer hole transport layers $ht_1$, $ht_2$. The voltage $U_1$ is applied in such a way that hole transport takes place from the first hole transport layer $ht_1$ through the modulator layer $et_m$ into the second hole transport layer $ht_2$. The first hole transport layer $ht_1$ is connected via a further contact to a second voltage source $U_h$ and via the latter to the electron transport layer $et_m$. A further voltage $U_h$ is thus applied to the electron transport layer, or modulation layer, $et_m$ and to the first hole transport layer $ht_1$.

The electron transport layer $et_m$ is a heavily doped n-type conducting layer. The hole current from the first hole transporter $ht_1$ to the second hole transporter $ht_2$ is influenced by this modulator layer $et_m$. Owing to the excess of holes in the electron transport layer $et_m$, where these are minority charge carriers, and the concomitant concentration gradient, a diffusion current flows so that the holes are transported to the second hole transporter $ht_2$. The holes injected into the first hole transport layer $ht_1$ are in this case accelerated in the strong electric field of the electron transporter $et_m$. The first hole transporter $ht_1$ is preferably heavily doped, so that there is a high conductivity. This improves the property of the hole modulator for modulation of the hole current. The number of free charge carriers in an undoped organic transport material is usually very low, and lies in the range of from $10^5/cm^3$ to $10^9/cm^3$. The doping is selected in such a way that the number of free charge carriers is increased by up to 10 orders of magnitude to a range of from $10^{15}/cm^3$ to $10^{19}/cm^3$. To this end, dopant concentrations in the range of from 0.01 vol % to 50 vol % are used.

The thickness $d_e$ of the electron transport layer, or modulator layer, $et_m$ must be less than the diffusion length $L_{diff}$ of the minority charge carriers, which in this case are holes. The diffusion length $L_{diff}$ can be determined from the charge carrier mobility $\mu$ and the lifetime $\tau$ of the free charge carriers.

For example, the electron transport material is Alq (tris (8-hydroxyquinolinato)aluminum). The field-dependent hole mobility $\mu_h$ in Alq is $$\mu_h(Alq) = 1.2 \cdot 10^{-7} \frac{cm^2}{V \cdot s} \cdot \exp\left(\sqrt{\frac{U_h/d_e}{1959 \text{ kV/cm}}}\right)$$

With the assumption of a free charge carrier lifetime $\tau$ of 50 ns, a maximum value of 10 nm is obtained for the layer thickness $d_e$ of an Alq modulator layer. This value is calculated from the hole mobility $\mu_h$ in Alq, from the lifetime $\tau$ of the charge carriers and from the electric field, which is directly proportional to the applied modulator voltage $U_h$.

Figure 2:
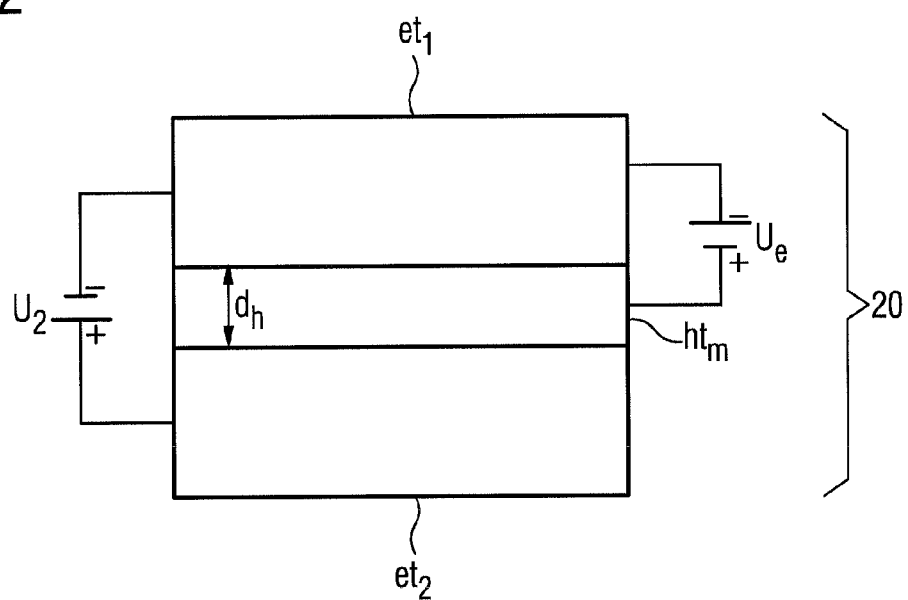
FIG. 2 shows an electron modulator.

FIG. 2 shows an electron modulator. It is in turn constructed from three organic semiconductor layers. The organic semiconductor layers are arranged vertically above one another, so that the current flows vertically through the component. A hole transport layer $ht_m$ is arranged above a second electron transport layer $et_2$. A first electron transport layer $et_1$ is in turn arranged above. The three layers lie on one another in such a way that large-area contact of the electron transport layer with the hole transport layer is respectively established. The hole transport layer $ht_m$ has a substantially smaller layer thickness $d_u$ than the electron transport layers $et_1$, $et_2$. The hole transport layer $ht_m$ constitutes the modulation layer for the electron flow. A voltage $U_2$ is applied to the two outer electron transport layers $et_1$, $et_2$ in such a way that an electron flow takes place from the first electron transporter $et_1$ to the second electron transporter $et_2$, i.e. through the hole transport layer $ht_m$. The latter, however, initially constitutes a barrier. The electron transport layer $et_1$ is provided with a further contact, so that a voltage $U_e$ can be applied between the first electron transport layer $et_1$ and the hole transport modulator layer $ht_m$. The voltage is applied in such a way that a flow of electrons takes place from the first electron transporter $et_1$ across the hole transporter $ht_m$. The barrier property of the modulator layer $ht_m$ decreases with an increase in the voltage $U_e$. By the current from the first electron transporter $et_1$ across the hole transporter $ht_m$, the total current from the first electron transporter $et_1$ to the second electron transporter $et_2$ can therefore be controlled.

An electron modulator is thus constructed in a similar way to the hole modulator construction in the vertical arrangement of a three-layer system that includes two electron transport layers $et_1$, $et_2$ and a hole transport layer $ht_m$ arranged between them. In order to ensure the best possible properties of the electron modulator layer $ht_m$, high charge carrier densities must be respected in the electron transport layer. To this end, above all, the second electron transport layer et$_2$ is heavily doped. In order to prevent recombination of charge carriers in the hole transport layer ht$_m$, i.e. the modulator layer of the electron modulator, the layer thickness d$_h$ of the modulator layer must again be kept so small that it does not exceed the diffusion length L$_{diff}$ of the electrons in the material, i.e. of the minority charge carriers in the modulator layer. Often, in this case, high charge carrier mobilities μ are associated with long diffusion lengths L$_{diff}$.

One example of a hole conductor, which may be used as a modulator layer in the electron modulator, is α-NPD (N,N'-di(naphthalen-1-yl)-N,N'-diphenylbenzidine). The field-dependent electron mobility μ$_e$ in α-NPD is $$\mu_e(\alpha - NPD) = 6.1 \cdot 10^{-6} \frac{cm^2}{V \cdot s} \cdot \exp\left(\sqrt{\frac{U_e/d_h}{1500 \text{ kV/cm}}}\right)$$

The maximum layer thickness for this hole transport layer is calculated from the electron mobility μ$_e$ and lifetime τ, as well as from the applied field, which is directly proportional to the modulation voltage U$_e$. If a free charge carrier lifetime τ of 50 ns is in turn assumed, the maximum value for the layer thickness d$_h$ of the modulator layer is calculated as 100 nm.

Examples of electron transport materials are:
2,2',2"-(1,3,5-benzenetriyl)-tris(1-phenyl-1-H-benzimidazole)
2-(4-biphenylyl)-5-(4-tert-butylphenyl)-1,3,4-oxadiazole
2,9-dimethyl-4,7-diphenyl-1,10-phenanthroline
8-hydroxyquinolinolato-lithium
4-(naphthalen-1-yl)-3,5-diphenyl-4H-1,2,4-triazole
1,3-bis[2-(2,2'-bipyridine-6-yl)-1,3,4-oxadiazo-5-yl]benzene
4,7-diphenyl-1,10-phenanthroline
3-(4-biphenylyl)-4-phenyl-5-tert-butylphenyl-1,2,4-triazole
bis(2-methyl-8-quinolinolate)-4-(phenylphenolato)aluminum
6,6'-bis[5-(biphenyl-4-yl)-1,3,4-oxadiazo-2-yl]-2,2'-bipyridyl
2-phenyl-9,10-di(naphthalen-2-yl)-anthracene
2,7-bis[2-(2,2'-bipyridin-6-yl)-1,3,4-oxadiazo-5-yl]-9,9-dimethylfluorene
1,3-bis[2-(4-tert-butylphenyl)-1,3,4-oxadiazo-5-yl]benzene
2-(naphthalen-2-yl)-4,7-diphenyl-1,10-phenanthroline
2,9-bis(naphthalen-2-yl)-4,7-diphenyl-1,10-phenanthroline
tris(2,4,6-trimethyl-3-(pyridin-3-yl)phenyl)borane
1-methyl-2-(4-(naphthalen-2-yl)phenyl)-1H-imidazo[4,5f][1,10]phenanthroline In order to increase the electron conductivity of these electron transport materials, they may be doped.

Examples of dopants are:
alkali metals, alkaline earth metals, lanthanides, such as Li, Na, K, Cs, Ca, Mg, Sr, Ba or Sm
inorganic salts which increase the electron conductivity: Cs$_2$CO$_3$
metalorganic complexes with a strongly reducing effect, such as W$_2$(TBD)$_4$, Mo$_2$(TBD)$_4$, where TBD is the anion of 1,5,7-triazabicyclo[4.4.0]dec-5-ene, or
metal(O) complexes such as Mo(CO)$_6$ or W(CO)$_6$.

Examples of hole transport materials are:
N,N'-bis(naphthalen-1-yl)-N,N'-bis(phenyl)-9,9-dimethylfluorene
N,N'-bis(3-methylphenyl)-N,N'-bis(phenyl)-9,9-diphenylfluorene
N,N'-bis(naphthalen-1-yl)-N,N'-bis(phenyl)-9,9-diphenylfluorene
N,N'-bis(naphthalen-1-yl)-N,N'-bis(phenyl)-2,2-dimethylbenzidine
N,N'-bis(3-methylphenyl)-N,N'-bis(phenyl)-9,9-spirobifluorene
2,2',7,7'-tetrakis(N,N-diphenylamino)-9,9'-spirobifluorene
N,N'-bis(naphthalen-1-yl)-N,N'-bis(phenyl)-benzidine
N,N'-bis(naphthalen-2-yl)-N,N'-bis(phenyl)-benzidine
N,N'-bis(3-methylphenyl)-N,N'-bis(phenyl)-benzidine
N,N'-bis(3-methylphenyl)-N,N'-bis(phenyl)-9,9-dimethylfluorene
N,N'-bis(naphthalen-1-yl)-N,N'-bis(phenyl)-9,9-spirobifluorene
di-[4-(N,N-ditolyl-amino)-phenyl]cyclohexane
2,2',7,7'-tetra(N,N-di-tolyl)amino-spiro-bifluorene
9,9-bis[4-(N,N-bis-biphenyl-4-yl-amino)phenyl]-9H-fluorene
2,2',7,7'-tetrakis[N-naphthalenyl(phenyl)-amino]-9,9-spiro-bifluorene
2,7-bis[N,N-bis(9,9-spiro-bifluorene-2-yl)-amino]-9,9-spirobifluorene
2,2'-bis[N,N-bis(biphenyl-4-yl)amino]-9,9-spiro-bifluorene
N,N'-bis(phenanthren-9-yl)-N,N'-bis(phenyl)-benzidine
N,N,N',N'-tetra-naphthalen-2-yl-benzidine
2,2'-bis(N,N-di-phenyl-amino)-9,9-spirobifluorene
9,9-bis[4-(N,N-bis-naphthalen-2-yl-amino)phenyl]-9H-fluorene
9,9-bis[4-(N,N'-bis-naphthalen-2-yl-N,N'-bis-phenyl-amino)-phenyl]-9H-fluorene
titanium oxide phthalocyanine
copper phthalocyanine
2,3,5,6-tetrafluoro-7,7,8,8,-tetracyano-quinodimethane
4,4',4"-tris(N-3-methylphenyl-N-phenyl-amino)triphenylamine
4,4',4"-tris(N-(2-naphthyl)-N-phenyl-amino)triphenylamine
4,4',4"-tris(N-(1-naphthyl)-N-phenyl-amino)triphenylamine
4,4',4"-tris(N,N-diphenyl-amino)triphenylamine
pyrazino[2,3-f][1,10]phenanthroline-2,3-dicarbonitrile
N,N,N',N'-tetrakis(4-methoxyphenyl)benzidine
2,7-bis[N,N-bis(4-methoxy-phenyl)amino]-9,9-spirobifluorene
2,2'-bis[N,N-bis(4-methoxy-phenyl)amino]-9,9-spirobifluorene
N,N'-di(naphthalen-2-yl)-N,N'-diphenylbenzene-1,4-diamine
N,N'-di-phenyl-N,N'-di-[4-(N,N-di-tolyl-amino)phenyl]-benzidine
N,N'-di-phenyl-N,N'-di-[4-(N,N-di-phenyl-amino)phenyl]-benzidine In addition, however, metalorganic complexes, such as tris(phenylpyridinato)iridium(III) or related compounds, are suitable as hole transport materials.

In order to increase the hole conductivities of these hole transport materials, they may be doped.

Examples of dopants are:
inorganic salts or oxides which increase the hole conductivity: MoO$_3$, WO$_3$, Re$_2$O$_7$, FeCl$_3$,
metalorganic complexes with a strong Lewis acid effect, such as Rh$_2$ (O$_2$CCF$_3$)$_4$, or Ru compounds,
organic acceptor molecules such as F$_4$-TCNQ.

Figure 3:
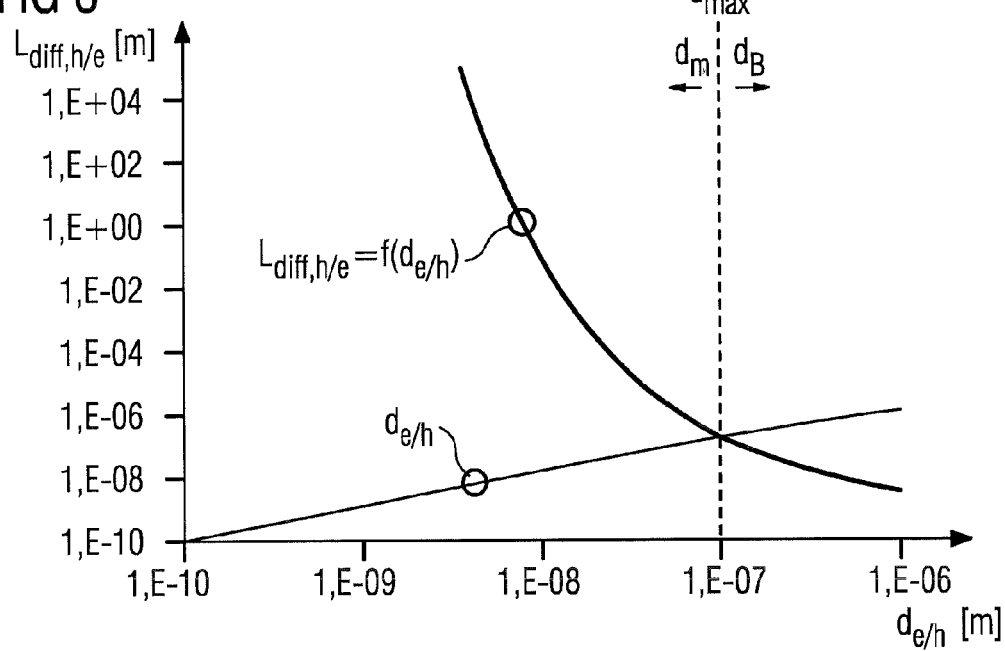
FIG. 3 shows a diagram with a plot of the layer thickness and diffusion length

FIG. 3 shows a diagram which illustrates the calculation of the maximum layer thickness d$_{max}$ of the modulator layer et$_m$,ht$_m$. The layer thickness d$_{e/h}$ of the modulator layer et$_m$,ht$_m$ is plotted on the abscissa. The modulator layer thicknesses d$_{e/h}$ are between $1 \times 10^{-10}$ m and $1 \times 10^{-6}$ m. The diffusion length L$_{diff}$ of the minority charge carriers in the modulator layer $et_m$,$ht_m$ is plotted on the ordinate. The diffusion length $L_{off}$ of the minority charge carriers is between $1\times10^{-10}$ m and $1\times10^4$ m. In the diagram, the modulator layer thickness values $d_{e/h}$ are first plotted. To this end, the diffusion lengths $L_{diff}$ of the minority charge carriers were plotted as a function of the layer thickness $d_{e/h}$ of the modulator layer $et_m$/$ht_m$. The dependency of the layer thickness $d_{e/h}$ is dictated by the field dependency of the diffusion length $L_{diff}$, or the charge carrier mobility μ.

The maximum layer thickness $d_{max}$ of a modulator layer $et_m$,$ht_m$ is denoted by a dashed line and $d_{max}$ in the diagram. For layer thicknesses less than $d_{max}$, a functional charge carrier modulator can be produced. For layer thicknesses $d_B$ which lie above $d_{max}$, the electron or hole transport layer respectively between the hole or electron transport layers forms a barrier layer, which constitutes a charge barrier, and throttles or reduces the charge flow irrespective of an applied voltage.

Figure 4:
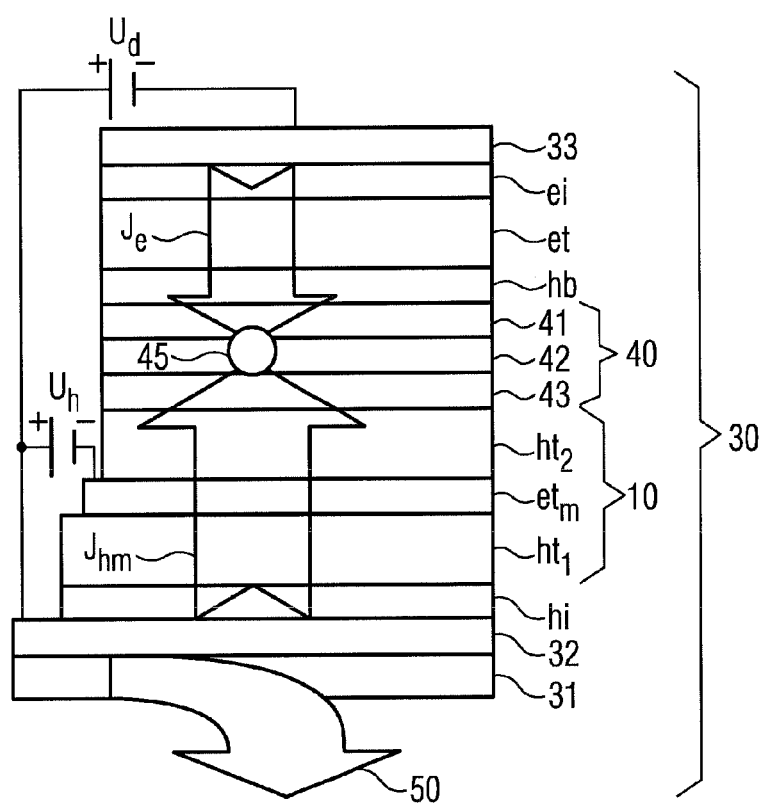
FIG. 4 shows an organic light-emitting diode having a hole modulator.

FIG. 4 shows a schematic structure of an organic light-emitting diode 30 having a hole modulator 10. From bottom to top, the layer stack first shows a substrate 31, which is for example a glass substrate. An anode 32 is applied on the glass substrate 31. The anode is preferably transparent, for example formed of indium tin oxide.

The light generated in the organic light-emitting diode 30 can be output from the component through the transparent anode 32 on the glass substrate 31. The light output 50 is indicated by an arrow. A hole injection layer $h_i$ is applied on the anode 32. Thereon there is a hole modulator 10, i.e. a first hole transport layer $ht_1$, an electron transport layer $et_m$ thereon and in turn a second hole transport layer $ht_2$ thereon. The modulator voltage $U_h$ is applied to the electron transport layer $et_m$ and to the anode 32. The hole modulator 10 is followed by the emission region 40. The emission region 40 may include a plurality of emitter layers. For example, a red emission layer 43, a green emission layer 42, and a blue emission layer 41 thereon, follow on from the hole transporters $ht_2$. Recombination 45 of the charge carriers preferably takes place in this emission region 40. The recombination zone 45 can be displaced by the hole and electron current. Thus, depending on the ratio of electrons to holes reaching the emission zone 40, more recombinations can take place in one of the emitter layers 41-43. For example, a hole blocker hb follows on above the emitter layers 41-43. An electron transport layer $et_m$ is deposited thereon. An electron injection layer $e_i$ is applied thereon. Above this, there is a cathode 33. A voltage $U_d$, by which the component is operated, is applied to the cathode 33 and anode 32. The voltage $U_d$ is applied in such a way that electrons are injected into the component at the cathode 33 and holes are injected into the component at the anode 32. The electron current $I_e$ through the injection and electron transport layers $e_i$, $e_t$ into the emitter layers 41-43 is denoted by an arrow from the cathode 33 in the direction of the recombination center 45. The hole current $I_h$ is similarly denoted by an arrow from the anode 32 through the hole modulator layers 10 into the recombination zone 45. The hole current $I_h$ which reaches the recombination zone 45 can be adjusted by the hole modulator 10.

Figure 5:
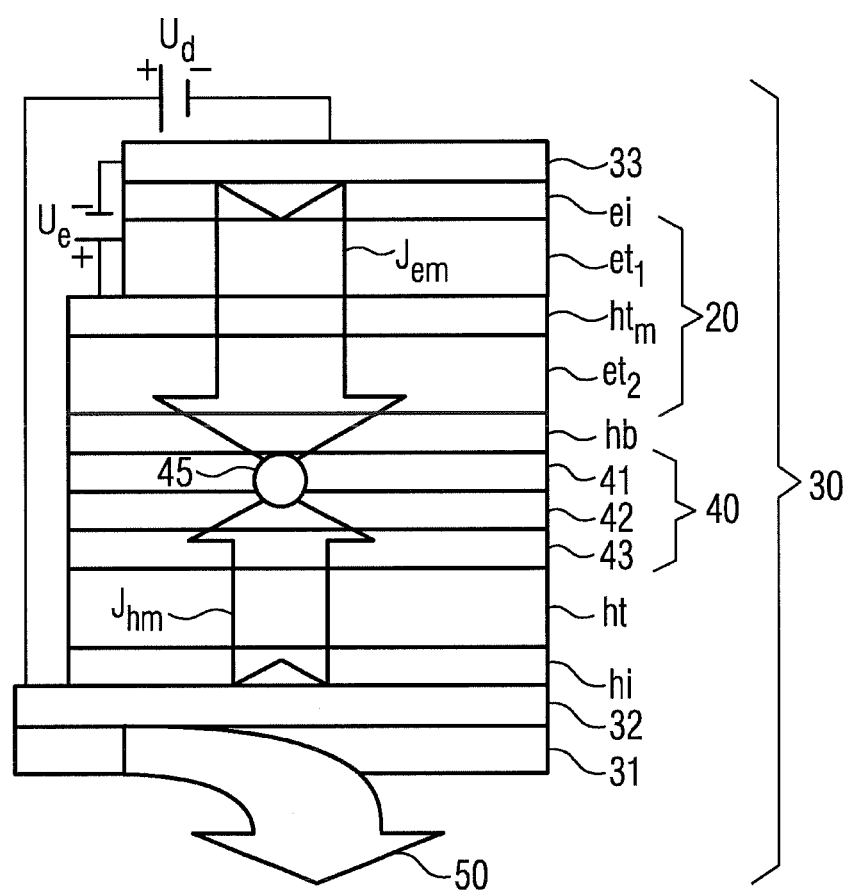
FIG. 5 shows an organic light-emitting diode having an electron modulator.

FIG. 5 in turn shows an organic light-emitting diode 30. It again comprises a layer stack of organic semiconductor layers, which lies between a cathode 33 and an anode 32 on a glass substrate 31. An arrow again indicates the light output 50 through the transparent anode 32 and the transparent substrate 31. The organic layers follow on from this substrate 31 and the anode 32: first a hole injection layer $h_i$, and a hole transporter ht thereon. The latter is followed by the emission region 40 comprising, for example, three emitter layers 43, 42, 41. A hole blocker hb is, for example, arranged above the emitter layers 41-43. Above the hole blocker is the electron transport region. The latter is an electron modulator 20. That is to say, first a second electron transporter $et_2$, a hole transporter $ht_m$ thereon for modulating the electrons, and a first electron transporter $et_1$ thereon, are arranged on the hole blocker layer hb. Above the electron modulator 20, there is furthermore an electron injection layer ei below the cathode 33. The component voltage $U_d$ is in turn applied to the cathode 33 and anode 32. This voltage $U_d$ is applied in such a way that an electron flow $I_e$ takes place from the cathode 33 into the organic light-emitting diode, and hole transport $I_u$ takes place from the anode 32 into the organic light-emitting diode. The modulator voltage $U_e$ is applied to the cathode 33 and to the hole transport modulator layer $ht_m$. It is applied directionally in such a way that an electron flow takes place from the cathode 33 through the electron injection layer $e_i$ and the first electron transport layer $et_1$ into the hole transporter $ht_m$. By application of the voltage $U_e$, the barrier property of the hole transporter $ht_m$ between the electron transport layers $et_1$/$et_2$ is reduced and the electron current $I_e$ is thus increased. The electron injection current $I_e$ modulated in this way is indicated by an arrow from the cathode 33 in the direction of the emission layers 40. The hole transport $I_u$ takes place from the anode 32 in the direction of the emission layers 40, and is also indicated by an arrow. Where electrons and holes encounter one another, recombination 45 of the charge carriers can take place. This position can be influenced by the ratio of electrons to holes. By the electron modulation, the recombination zone 45 within the emission region 40 can be displaced into the different emission layers 41-43.

Figure 6:
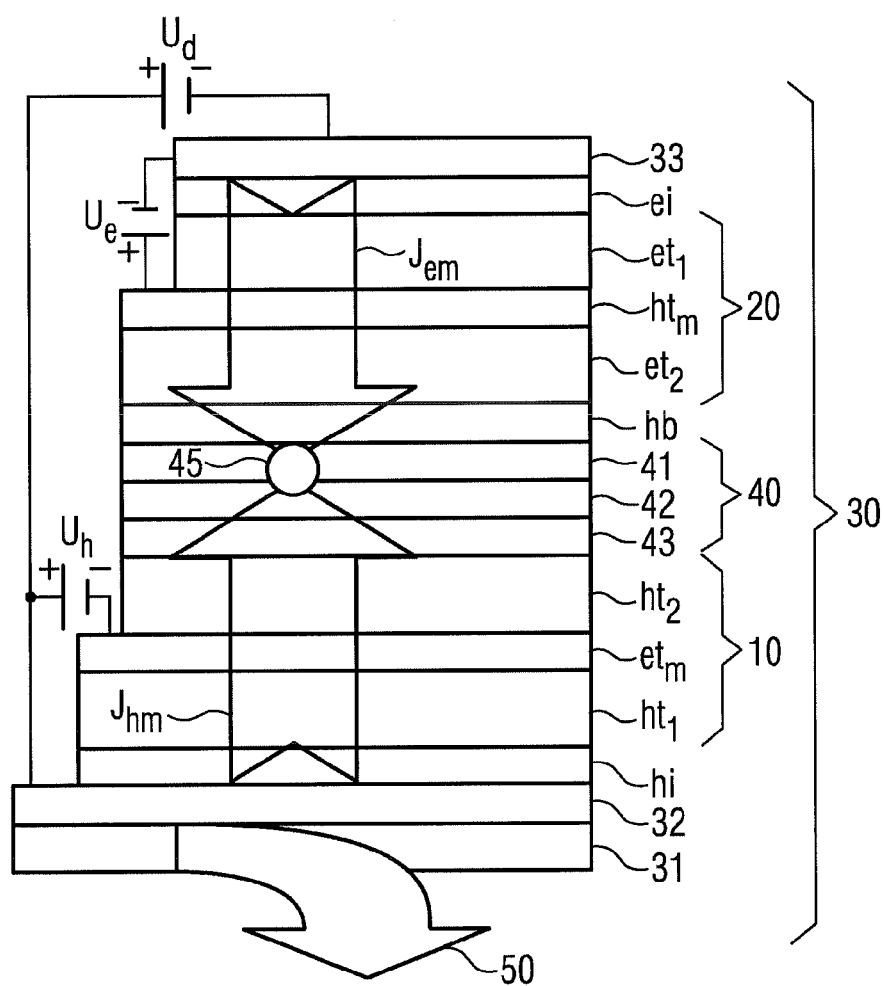
FIG. 6 shows an organic light-emitting diode having an electron modulator and a hole modulator.

Lastly, FIG. 6 again shows an organic light-emitting diode 30 having an electron modulator 20 and a hole modulator 10. That is to say, the layer stack of organic semiconductor layers comprises a hole modulator 10, an electron modulator 20 and an emission layer system 40. The hole modulator is in turn applied on a hole injection layer $h_i$, which is itself applied on an anode 32 on a glass substrate 31. Above the hole modulator 10 there are the emission layers 40, a hole blocker hb thereon, and above this there is the electron modulator 20. The electron injection from the cathode 33 into the organic light-emitting diode takes place across an electron injection layer $e_i$, which is arranged between the cathode 33 and the electron modulator 20. In order to modulate the charge carriers, the component voltage $U_d$ is applied to the cathode 33 and the anode 32, the hole modulation voltage $U_h$ is additionally applied to the electron transport layer $et_m$ of the hole modulator 10, and the electron modulation voltage $U_e$ is additionally applied to the hole transport layer $ht_m$ of the electron modulator 20. In the organic light-emitting diode 30, a hole blocker hb may be introduced on the cathode side and an electron blocker may be introduced on the anode side, in order to deliberately confine the individual charge carriers in the emitting layer 40.

The invention has been described in detail with particular reference to preferred embodiments thereof and examples, but it will be understood that variations and modifications can be effected within the spirit and scope of the invention covered by the claims which may include the phrase "at least one of A, B and C" as an alternative expression that means one or more of A, B and C may be used, contrary to the holding in Superguide v. DIRECTV, 69 USPQ2d 1865 (Fed. Cir. 2004).

The invention claimed is:

1. A current-controlled component comprising:
   a light emission region including at least one emission layer configured to emit light of at least one color; and
   at least one of:
   a hole modulator having a multiple hole transport layer arrangement including
      a first hole transport layer,
      a second hole transport layer,
      an electron transport layer arranged between the first hole transport layer and the second hole transport layer and configured as a first modulation layer, the first modulation layer having a first modulation layer contact for a first modulation voltage, generated by a first modulation voltage source, by which a first modulation current across the first modulation layer is generated, and
      a first modulation current flow path, including the first modulation voltage source connected to the first modulation layer contact, through the first modulation layer and the first hole transport layer, wherein the light emission region is arranged outside the first modulation current flow path, and wherein the first modulation current controls a component current from the first hole transport layer to the second hole transport layer through the first modulation layer, or
   an electron modulator having a multiple electron transport layer arrangement including
      a first electron transport layer,
      a second electron transport layer,
      a hole transport layer arranged between the first electron transport layer and the second electron transport layer and configured as a second modulation layer, the second modulation layer having a second modulation layer contact for a second modulation voltage generated by a second modulation voltage source, by which a second modulation current across the second modulation layer is generated,
      a second modulation current flow path, including the second modulation voltage source connected to the second modulation layer contact, through the second modulation layer and the first electron transport layer, wherein the light emission region is arranged outside the second modulation current flow path, and wherein the second modulation current controls a second component current from the first electron transport layer to the second electron transport layer through the second modulation layer.

2. The current-controlled component as claimed in claim 1, wherein the organic semiconductor layers lie on one another in a vertical layer stack.

3. The current-controlled component as claimed in claim 1, further comprising one of:
   heterojunctions formed between the organic semiconductor layers lying on one another, or
   intrinsic interlayers arranged between the organic semiconductor layers.

4. The current-controlled component as claimed in claim 1, wherein
   the first modulation layer in the multiple hole transport layer arrangement has a thickness which is less than a diffusion length of minority charge carriers in a semiconductor material of the first modulation layer, or
   the second modulation layer in the multiple electron transport layer arrangement has a thickness which is less than a diffusion length of minority charge carriers in a semiconductor material of the second modulation layer.

5. The current-controlled component as claimed in claim 1, wherein
   in the multiple hole transport layer arrangement, the first modulation voltage is applied to the first modulation layer and to the first hole transport layer so that majority charge carriers in a semiconductor material of the first hole transport layer and the second hole transport layer and minority charge carriers in a semiconductor material of the first modulation layer are moved from the first hole transport layer into the first modulation layer, or
   in the multiple electron transport layer arrangement, the second modulation voltage is applied to the second modulation layer and to the first electron transport layer so that majority charge carriers in a semiconductor material of the first electron transport layer and the second electron transport layer and minority charge carriers in a semiconductor material of the second modulation layer are moved from the first electron transport layer into the second modulation layer.

6. The current-controlled component as claimed in 1, wherein:
   in the multiple hole transport layer arrangement, at least the first modulation layer and one of the first and second hole transport layers have a doping concentration of between 0.01 vol % and 10 vol %, or
   in the multiple electron transport layer arrangement, at least the second modulation layer and one of the first and second electron transport layers have a doping concentration of between 0.01 vol % and 10 vol %.

7. The current-controlled component as claimed in claim 1, wherein:
   in the multiple hole transport layer arrangement, the first modulation layer has a doping concentration of between 0.01 vol % and 10 vol %, or
   in the multiple electron transport layer arrangement, the second modulation layer has a doping concentration of between 0.01 vol % and 10 vol %.

8. An organic light-emitting diode comprising at least one current-controlled component as claimed in claim 1.

9. The organic light-emitting diode as claimed in claim 8, comprising an emission zone comprising at least two emission layers which emit light of different colors.

10. An organic light-emitting diode comprising at least one current-controlled component as claimed in claim 1, wherein
    in the multiple hole transport layer arrangement, a color rendering of the organic light-emitting diode is varied by application of the first modulation voltage, or
    in the multiple electron transport layer arrangement, a color rendering of the organic light-emitting diode is varied by application of the second modulation voltage.

11. An organic light-emitting diode comprising a current-controlled component as claimed in claim 1, wherein:
    in the multiple hole transport layer arrangement, efficiency is variable by application of the first modulation voltage, or
    in the multiple electron transport layer arrangement, efficiency is variable by application of the second modulation voltage.

12. An organic light-emitting diode comprising: a multiple hole transport layer arrangement including a first hole transport layer,
a second hole transport layer,
a first modulation layer arranged between the first hole transport layer and the second hole transport layer and being an electron transport layer, the first modulation layer having a first contact for a first modulation voltage, generated by a first modulation voltage source, by which a first modulation current across the first modulation layer is generated, and
a first modulation current flow path, including the first modulation voltage source connected to the first modulation layer contact, through the first modulation layer and the first hole transport layer, and wherein the first modulation current controls a component current from the first hole transport layer to the second hole transport layer through the first modulation layer;

a multiple electron transport layer arrangement including
a first electron transport layer,
a second electron transport layer, and
a second modulation layer arranged between the first electron transport layer and the second electron transport layer and being a hole transport layer, the second modulation layer having a second contact for a second modulation voltage, generated by a second modulation voltage source, by which a second modulation current across the second modulation layer is generated,
a second modulation current flow path, including the second modulation voltage source connected to the second modulation layer contact, through the second modulation layer and the first electron transport layer, and wherein the second modulation current controls a second component current from the first electron transport layer to the second electron transport layer through the second modulation layer; and an emission zone comprising at least one emission layer and interposed between the multiple hole transport layer and the multiple electron transport layer arrangement, the emission zone configured to receive a hole current from the multiple hole transport layer arrangement and an electron current from the multiple electron transport layer arrangement wherein the emission zone is arranged outside both the first modulation current flow path and the second modulation current flow path.

\* \* \* \* \*